US012438069B2

(12) United States Patent
Niu et al.

(10) Patent No.: US 12,438,069 B2
(45) Date of Patent: Oct. 7, 2025

(54) SEMICONDUCTOR POWER MODULE PACKAGE HAVING LEAD FRAME ANCHORED BARS

(71) Applicant: ALPHA AND OMEGA SEMICONDUCTOR INTERNATIONAL LP, Toronto (CA)

(72) Inventors: Zhiqiang Niu, Santa Clara, CA (US); Bum-Seok Suh, Seongnam (KR); Junho Lee, Suwon-si (KR); Jong-Mu Lee, Yongin-si (KR); Jun Lu, San Jose, CA (US); Xiaorong Ge, Pleasanton, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 741 days.

(21) Appl. No.: 17/722,682

(22) Filed: Apr. 18, 2022

(65) Prior Publication Data
US 2023/0335474 A1 Oct. 19, 2023

(51) Int. Cl.
*H01L 23/495* (2006.01)
*H01L 23/00* (2006.01)
*H03K 17/567* (2006.01)
*H03K 17/687* (2006.01)

(52) U.S. Cl.
CPC .. *H01L 23/49575* (2013.01); *H01L 23/49503* (2013.01); *H01L 23/49555* (2013.01); *H01L 23/49562* (2013.01); *H01L 24/16* (2013.01); *H01L 2224/48177* (2013.01); *H03K 17/567* (2013.01); *H03K 17/6871* (2013.01)

(58) Field of Classification Search
CPC ......... H01L 23/49575; H01L 23/49503; H01L 23/49555; H01L 23/49562; H01L 24/16; H01L 2224/48177; H01L 23/3735; H01L 23/49531; H01L 23/49537; H01L 25/072; H03K 17/567; H03K 17/6871
USPC .......................................................... 257/676
See application file for complete search history.

(56) References Cited

U.S. PATENT DOCUMENTS

| 6,831,352 | B1 * | 12/2004 | Tsai | .................. | H01L 23/49575 |
|  |  |  |  |  | 257/676 |
| 7,808,084 | B1 * | 10/2010 | Lee | .................. | H01L 23/49503 |
|  |  |  |  |  | 257/676 |
| 10,141,249 | B2 | 11/2018 | Niu et al. |  |  |

(Continued)

FOREIGN PATENT DOCUMENTS

KR 20090049012 A * 5/2009

*Primary Examiner* — Duy T Nguyen
(74) *Attorney, Agent, or Firm* — Chen-Chi Lin

(57) ABSTRACT

A power module includes a lead frame, a substrate mounted on the lead frame, a first anchor pad, a second anchor pad, a plurality of die pads, and a plurality of transistor dies. The lead frame includes a first lead frame anchored bar attached to the first anchor pad, and a second lead frame anchored bar attached to the second anchor pad. The power module may include a single control IC or two or more control ICs. For the case including a single control IC, the singe control IC controls a first transistor, a second transistor, a third transistor, a fourth transistor, a fifth transistor, and a sixth transistor. For the case including two control ICs, a low voltage IC controls a first transistor, a second transistor, and a third transistor and the high voltage IC controls a fourth transistor, a fifth transistor, and a sixth transistor.

11 Claims, 14 Drawing Sheets

(56) References Cited

U.S. PATENT DOCUMENTS

| | | |
|---|---|---|
| 10,177,080 B2 | 1/2019 | Niu et al. |
| 10,600,727 B2 | 3/2020 | Niu et al. |
| 2003/0107120 A1* | 6/2003 | Connah ............... H01L 25/16 257/691 |
| 2003/0141578 A1* | 7/2003 | Corisis ............ H01L 23/49541 257/E23.079 |
| 2004/0080046 A1* | 4/2004 | Choon Kuan ......... H01L 24/73 257/738 |
| 2004/0187551 A1* | 9/2004 | Iwabuchi ........... H01L 21/4842 72/412 |
| 2007/0099344 A1* | 5/2007 | Lee ................. H01L 23/49551 257/E23.047 |
| 2007/0145609 A1* | 6/2007 | Zhang .............. H01L 23/49575 257/676 |
| 2019/0006270 A1* | 1/2019 | Niu ................. H01L 23/49562 |

* cited by examiner

SEMICONDUCTOR POWER MODULE PACKAGE HAVING LEAD FRAME ANCHORED BARS

FIELD OF THE INVENTION

This invention relates generally to a semiconductor power module package. More particularly, the present invention relates to a semiconductor power module package having lead frame anchored bars.

BACKGROUND OF THE INVENTION

Power modules for surface mount devices (SMDs), including gate drives and protection integrated circuits (ICs), are applied in compact and high power density applications. It is challenging to improve the thermal performance of the power modules.

A conventional reverse current insulated gate bipolar transistor (RC-IGBT) under typical load of 0.156 watt for each die will lead to 75.8° C. maximum temperature and under heavy load of 0.351 watt for each die will lead to 130° C. maximum temperature. A power module of instant application, with exposed dual-in-line functional terminals, under typical load of 0.156 watt for each die will lead to 59.6° C. maximum temperature and under heavy load of 0.351 watt for each die will lead to 96° C. maximum temperature.

SUMMARY OF THE INVENTION

The present invention discloses a power module comprises a lead frame, a substrate mounted on the lead frame, a first anchor pad on the substrate, a second anchor pad on the substrate, a plurality of die pads on the substrate, and a plurality of transistor dies on the plurality of die pads. The lead frame comprises a first lead frame anchored bar attached to the first anchor pad, and a second lead frame anchored bar attached to the second anchor pad.

The power module may include a single control IC or two or more control ICs. For the case including a single control IC, the singe control IC controls a first transistor, a second transistor, a third transistor, a fourth transistor, a fifth transistor, and a sixth transistor. For the case including two control ICs, a low voltage IC controls a first transistor, a second transistor, and a third transistor and the high voltage IC controls a fourth transistor, a fifth transistor, and a sixth transistor.

DETAILED DESCRIPTION OF THE INVENTION

Figure 1A:
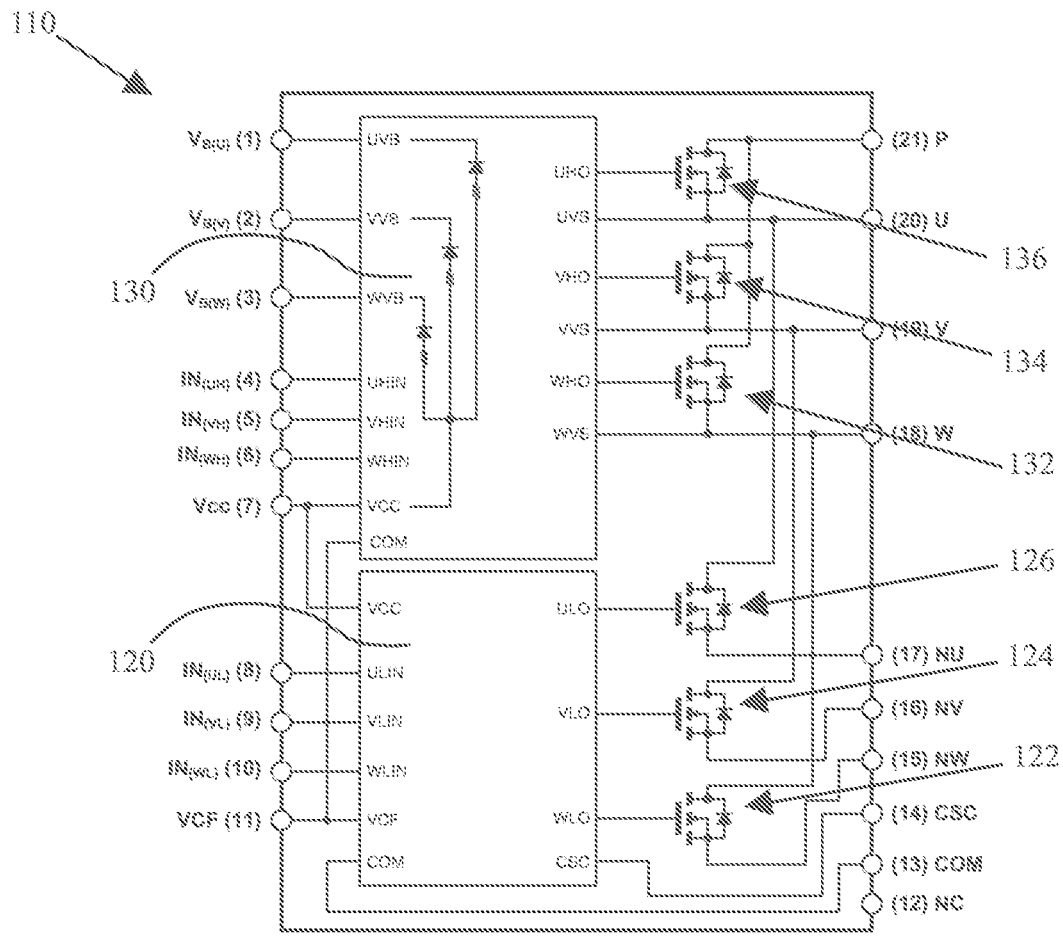
FIGS. 1A, 1B, and 1C show three circuit diagrams of power modules each containing two control ICs, for driving motors in examples of the present disclosure.
Figure 5A:
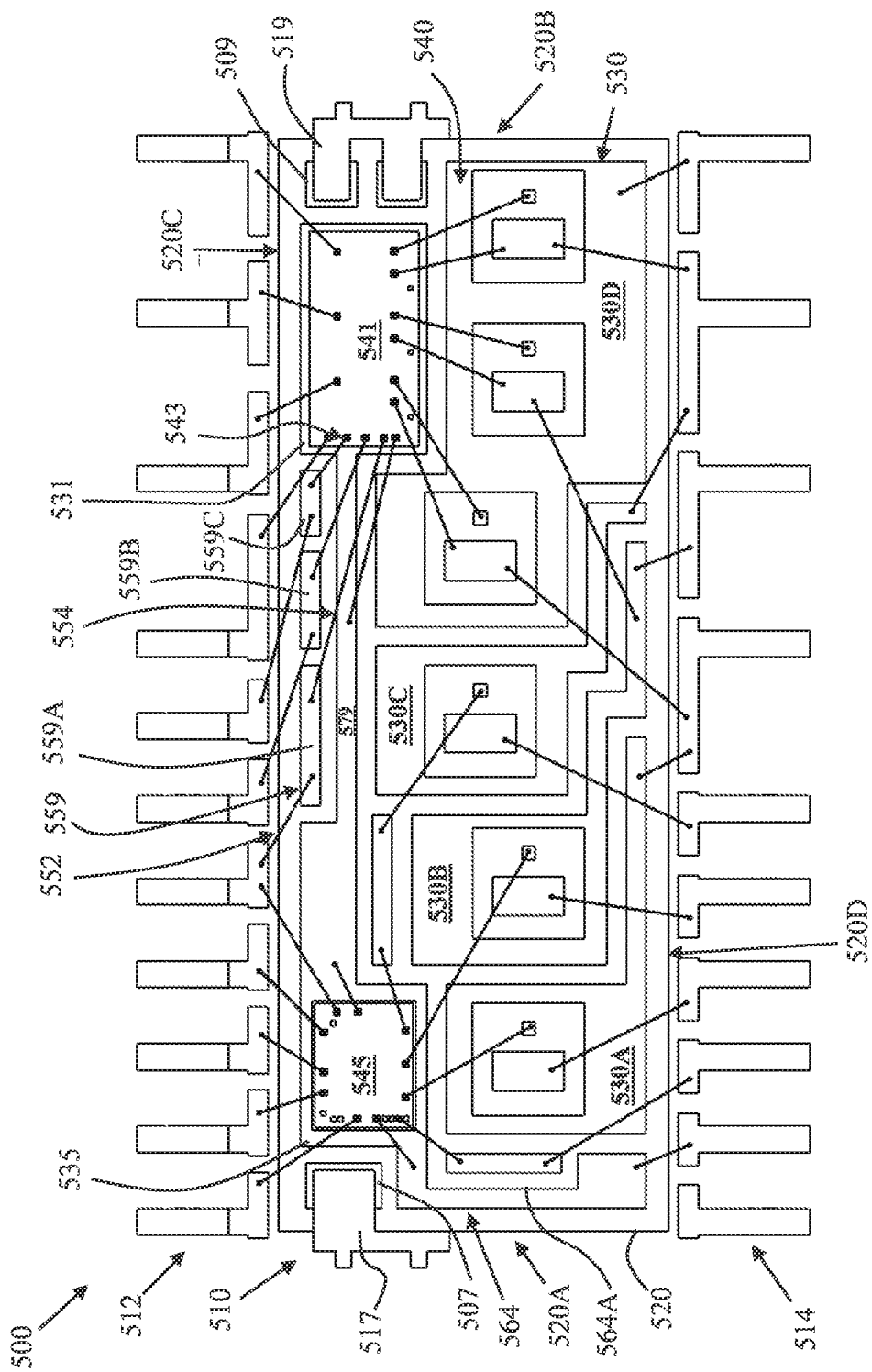
FIGS. 5A, 5B, and 5C show three power modules each containing two control ICs in examples of the present disclosure.

FIG. 1A shows a circuit diagram 110 of a power module (FIG. 5A shows corresponding structure) for driving a motor in examples of the present disclosure. In one example, the power module is an intelligent power module (IPM). The circuit diagram 110 includes low voltage IC 120 and a high voltage IC 130. The low voltage IC 120 controls a first transistor 122, a second transistor 124 and a third transistor 126. The high voltage IC 130 controls a fourth transistor 132, a fifth transistor 134 and a sixth transistor 136. In examples of the present disclosure, the transistors are metal-oxide-semiconductor field-effect transistors (MOSFETs). In examples of the present disclosure, the transistors are insulated gate bipolar transistors (IGBTs).

Figure 1B:
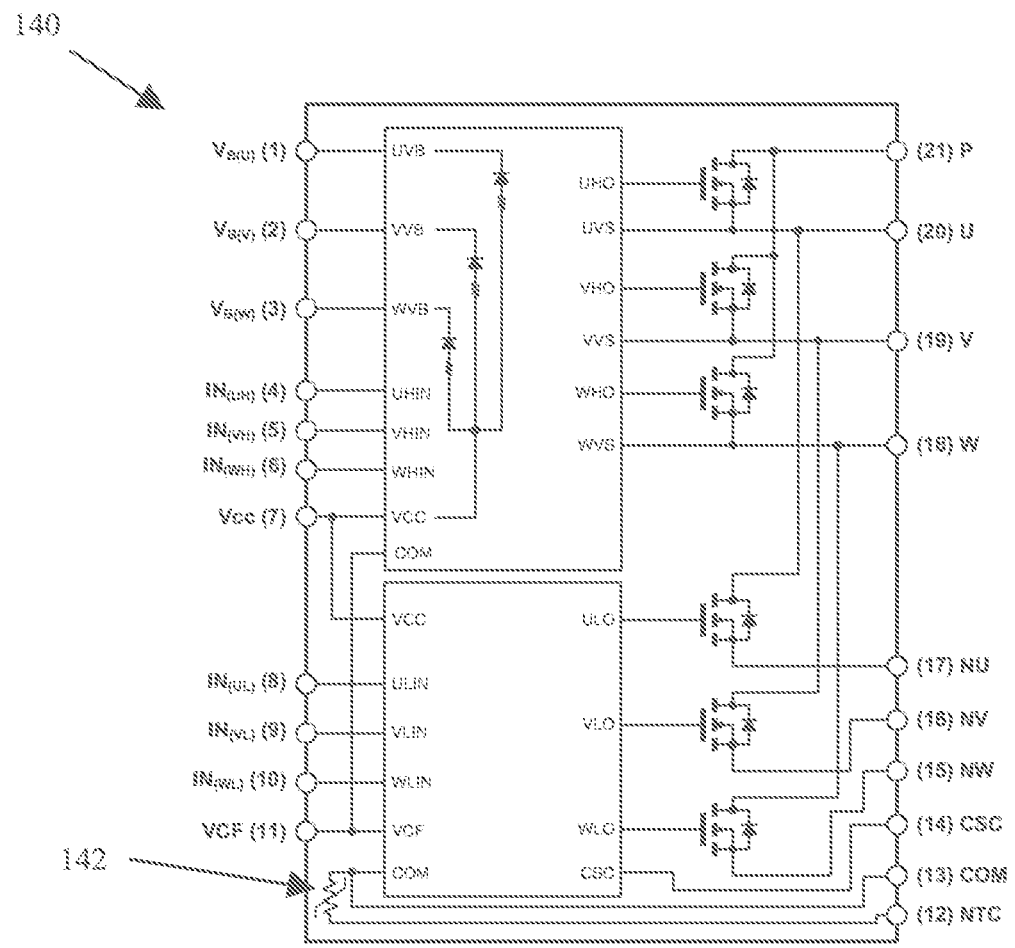
Figure 5B:
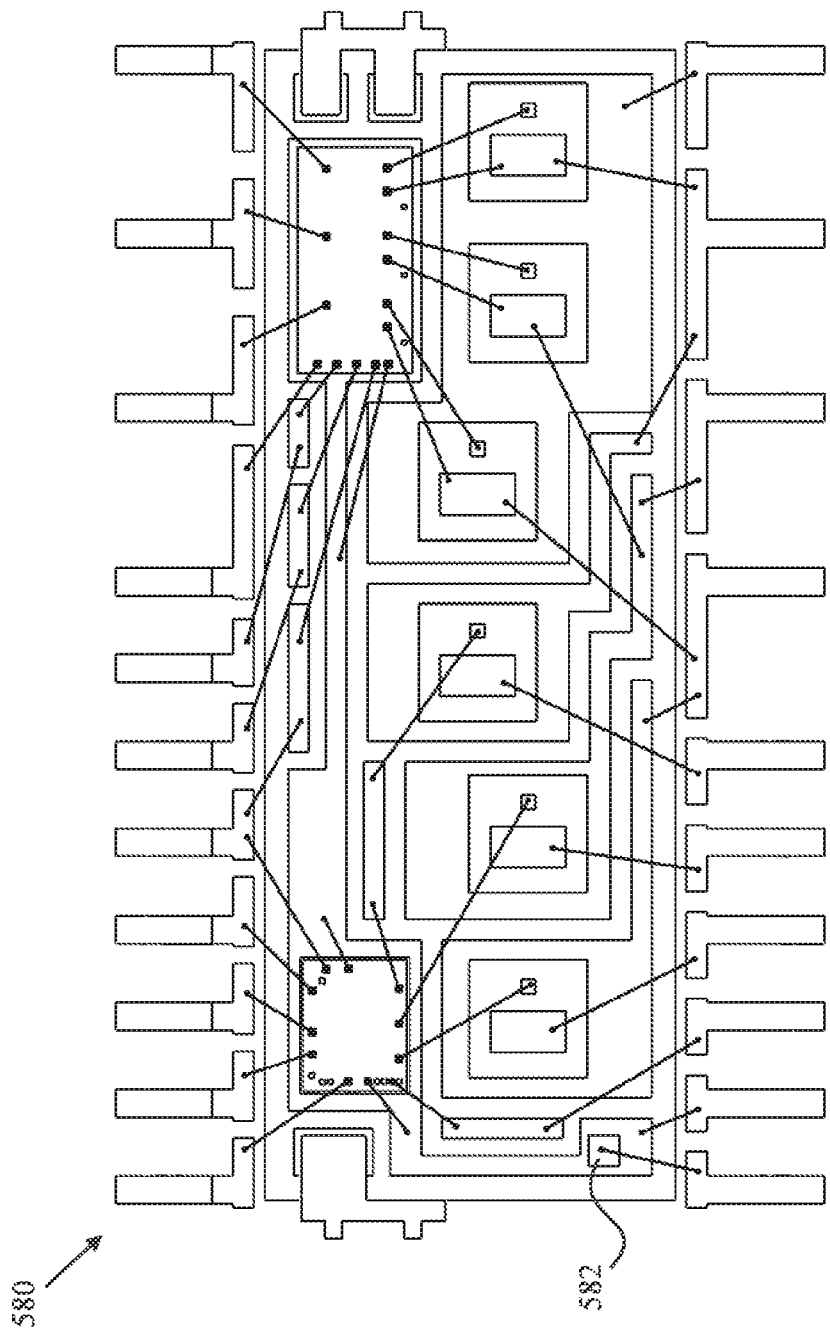

FIG. 1B shows a circuit diagram 140 of a power module (FIG. 5B shows corresponding structure) for driving a motor in examples of the present disclosure. The circuit diagram 140 of FIG. 1B is similar to the circuit diagram 110 of FIG. 1A. The circuit diagram 140 of FIG. 1B includes a negative temperature chip (NTC) 142 that is not present in the circuit diagram 110 of FIG. 1A.

Figure 1C:
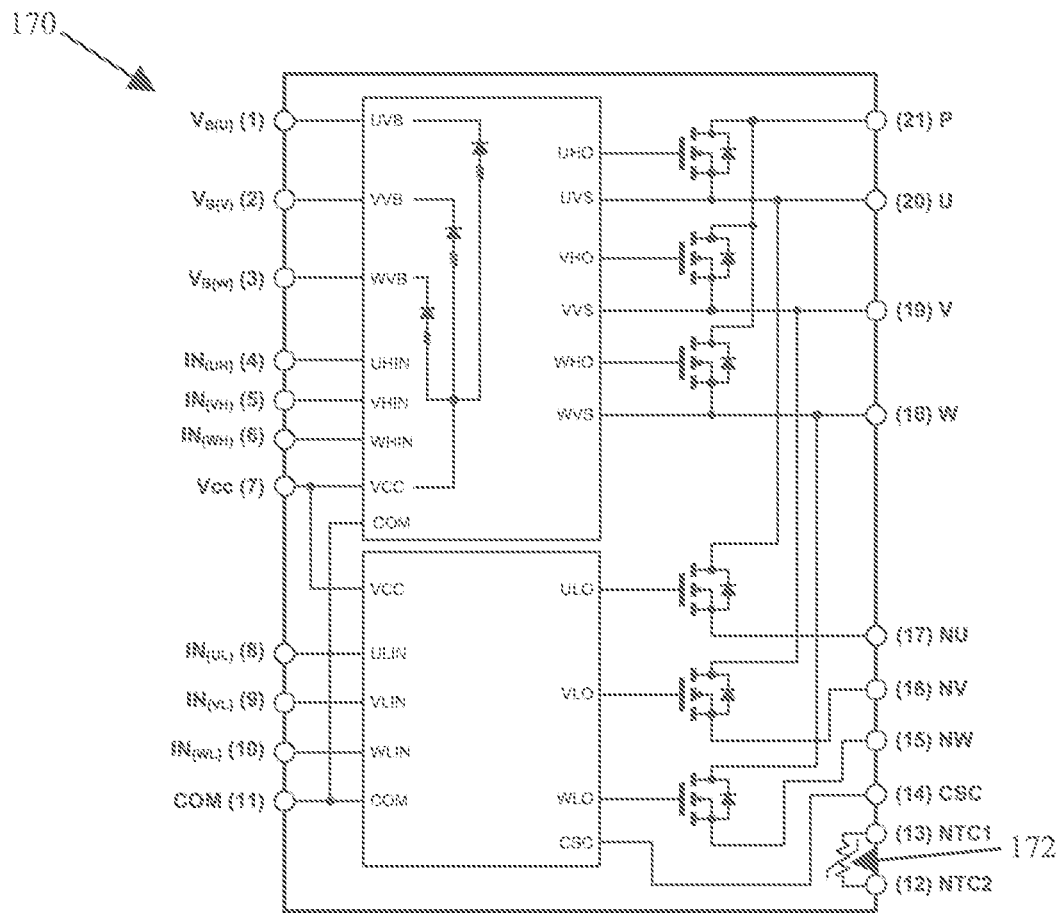
Figure 5C:
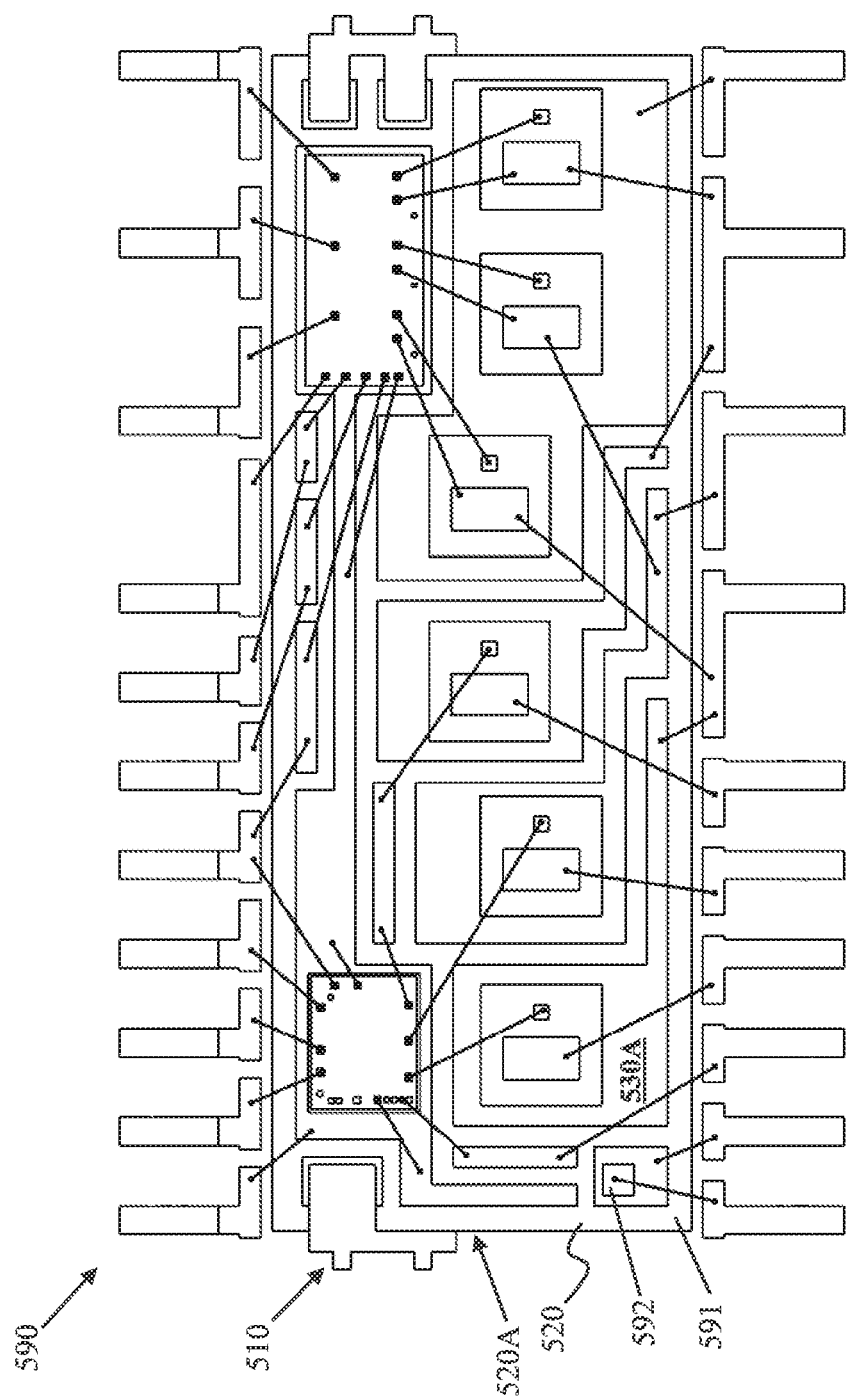

FIG. 1C shows a circuit diagram 170 of a power module (FIG. 5C shows corresponding structure) for driving a motor in examples of the present disclosure. The circuit diagram 170 of FIG. 1C is similar to the circuit diagram 140 of FIG. 1B. The NTC 172 of the circuit diagram 170 of FIG. 1C does not connect to a common pin. The NTC 142 of the circuit diagram 140 of FIG. 1B connects to a common pin.

Figure 2A:
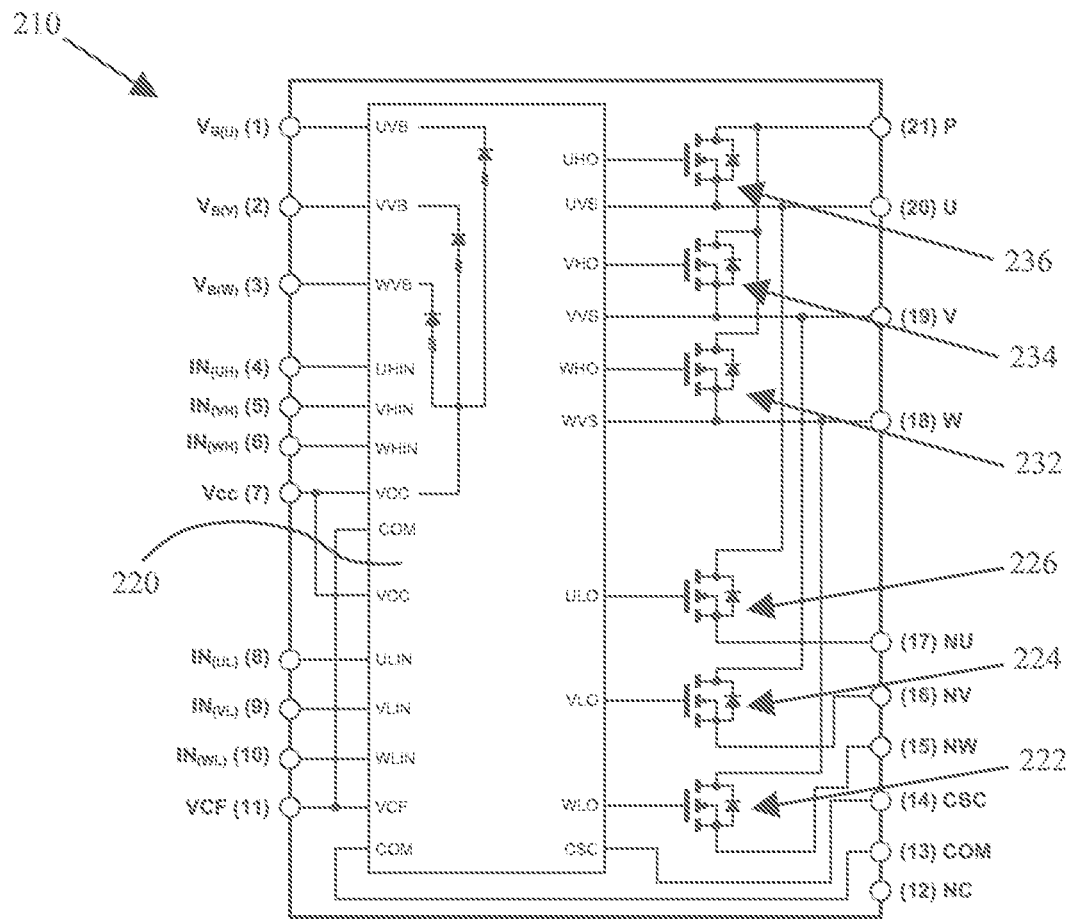
FIGS. 2A, 2B, and 2C show three circuit diagrams of power modules each containing a single control IC, for driving motors in examples of the present disclosure.
Figure 6A:
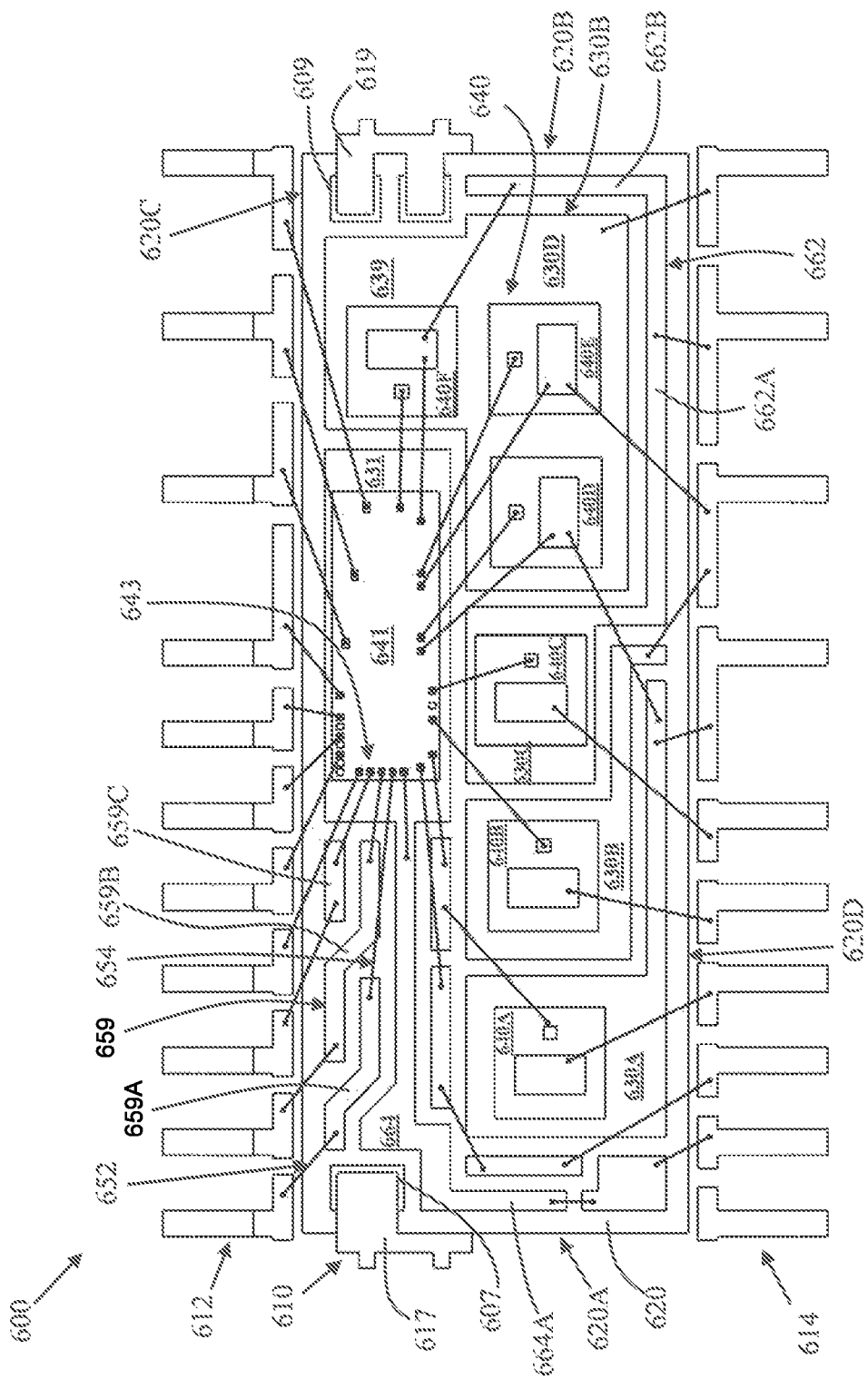
FIGS. 6A, 6B, and 6C show three power modules each containing a single control IC in examples of the present disclosure.

FIG. 2A shows a circuit diagram 210 of a power module (FIG. 6A shows corresponding structure) for driving a motor in examples of the present disclosure. The circuit diagram 210 includes a single control IC 220. The single control IC 220 controls a first transistor 222, a second transistor 224, a third transistor 226, a fourth transistor 232, a fifth transistor 234 and a sixth transistor 236.

Figure 2B:
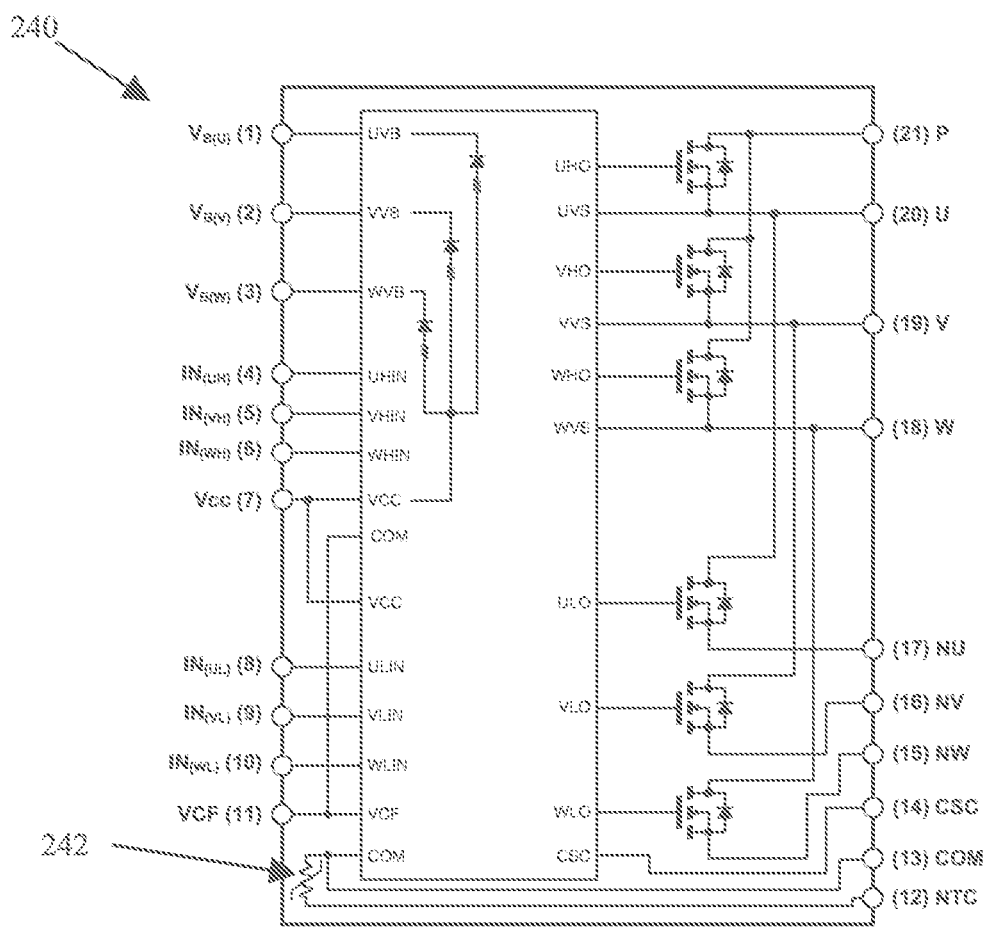
Figure 6B:
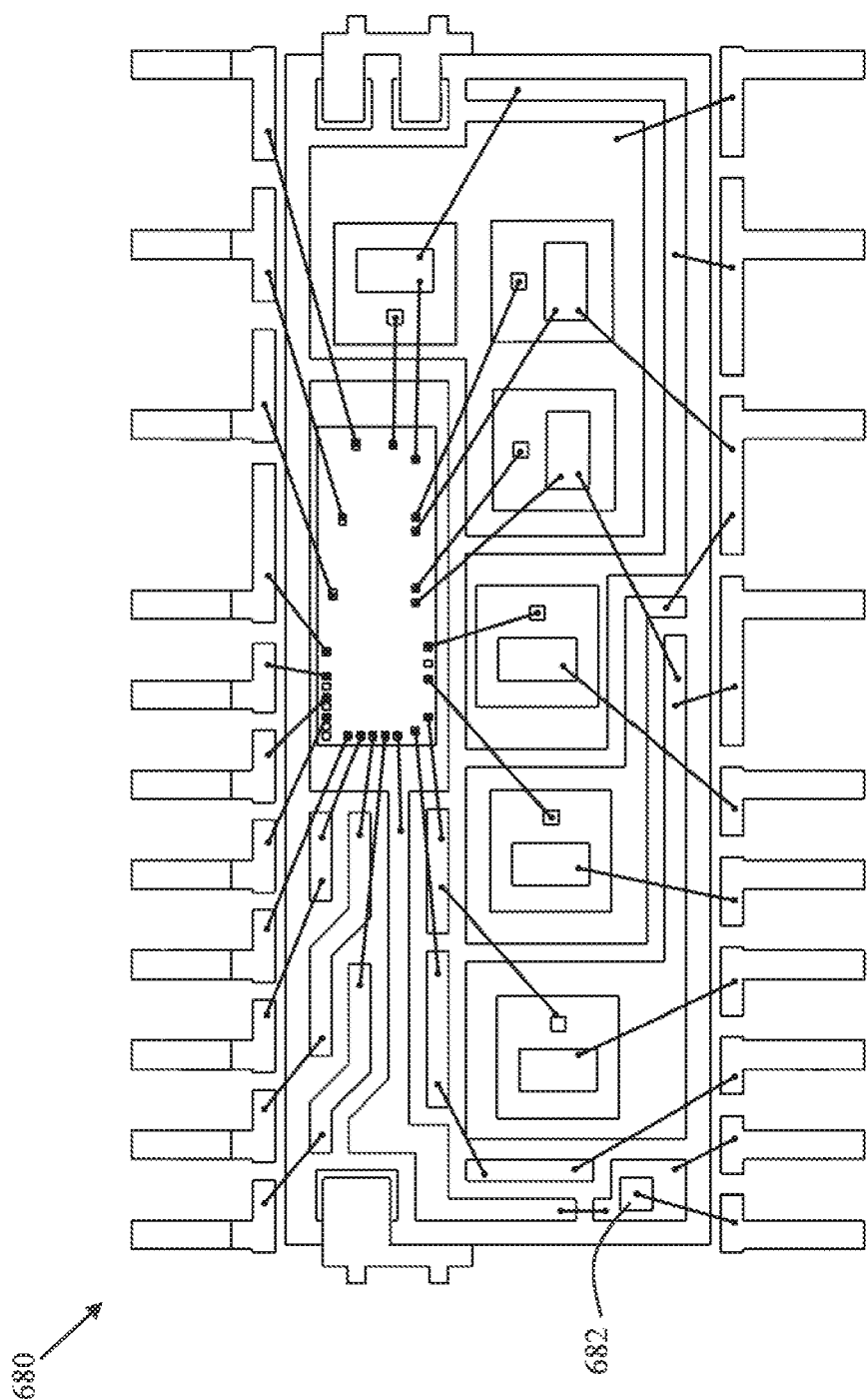

FIG. 2B shows a circuit diagram 240 of a power module (FIG. 6B shows corresponding structure) for driving a motor in examples of the present disclosure. The circuit diagram 240 of FIG. 2B is similar to the circuit diagram 210 of FIG. 2A. The circuit diagram 240 of FIG. 2B includes an NTC 242 that is not present in the circuit diagram 210 of FIG. 2A.

Figure 2C:
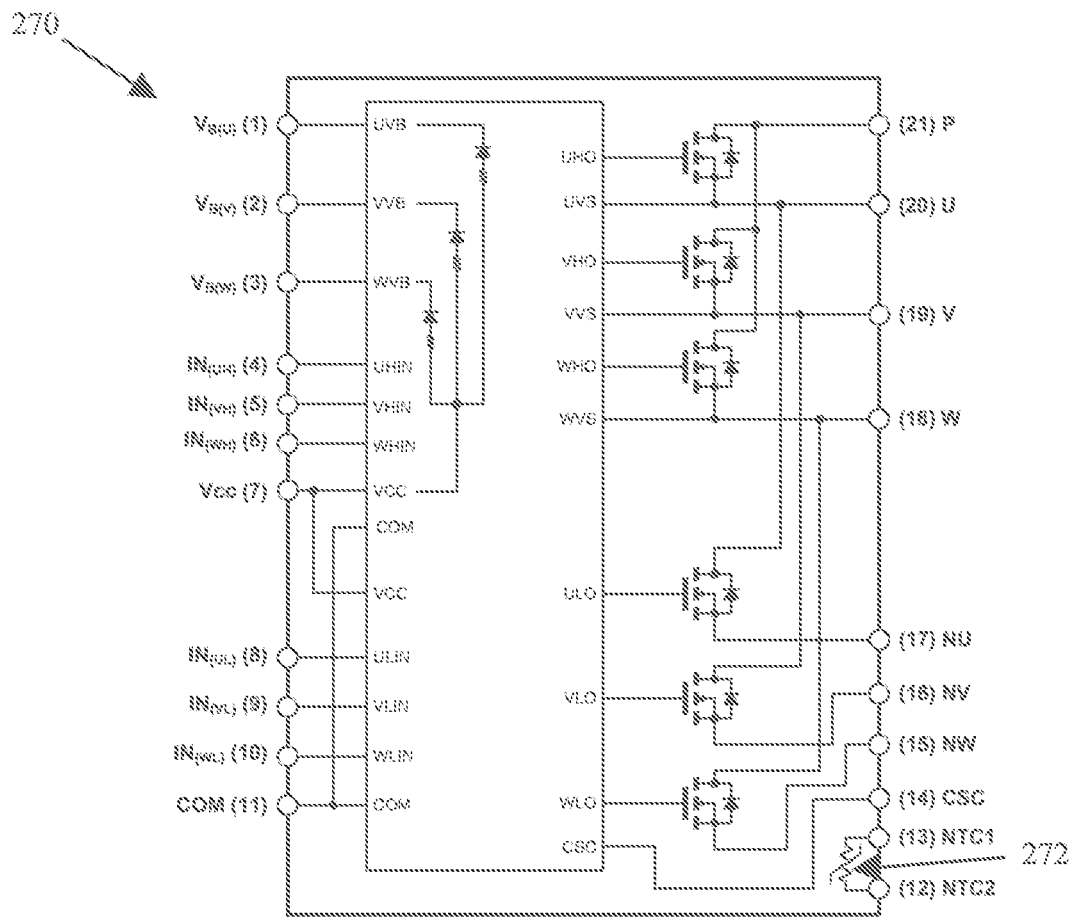
Figure 6C:
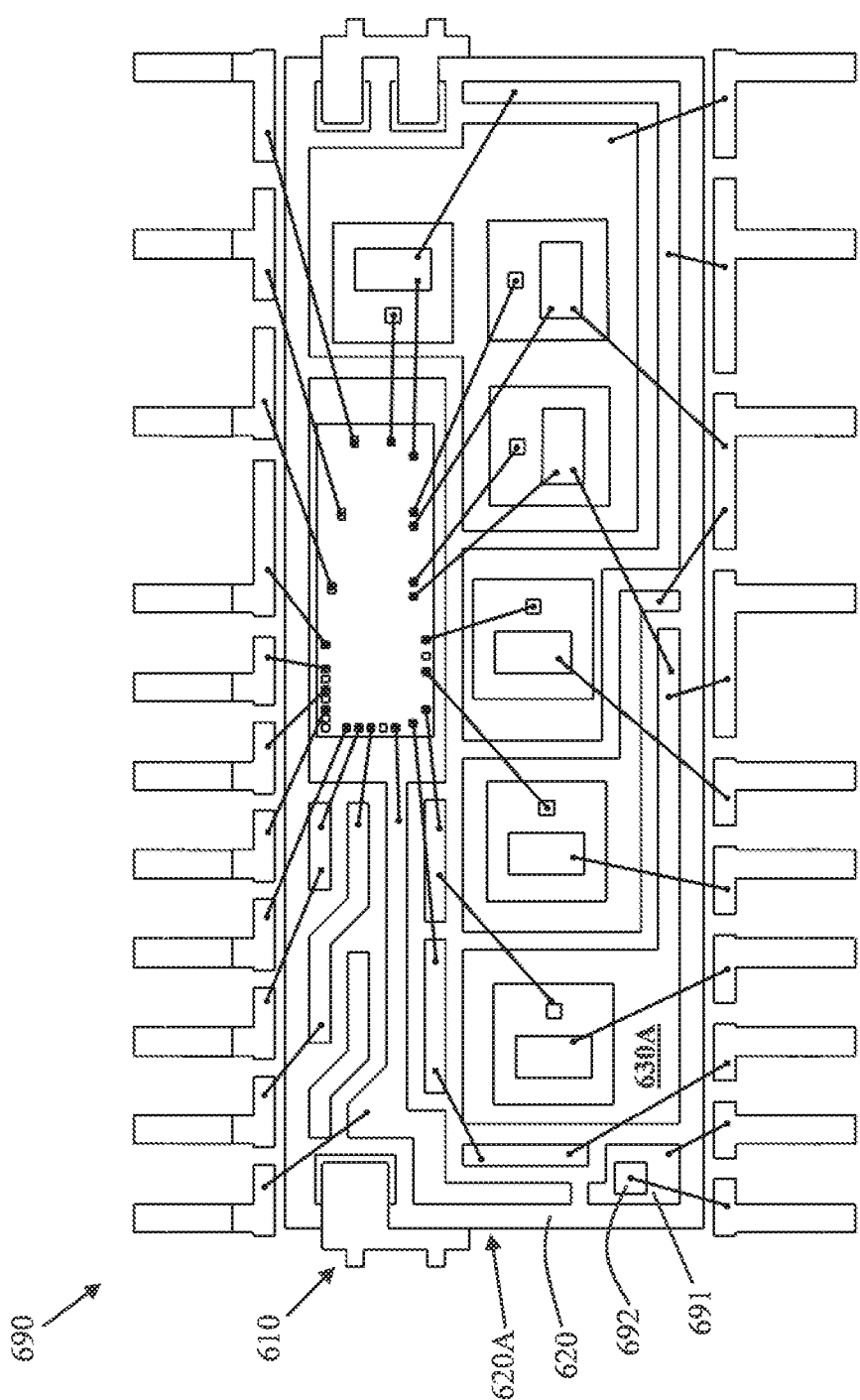

FIG. 2C shows a circuit diagram 270 of a power module (FIG. 6C shows corresponding structure) for driving a motor in examples of the present disclosure. The circuit diagram 270 of FIG. 2C is similar to the circuit diagram 240 of FIG. 2B. The NTC 272 of the circuit diagram 270 of FIG. 2C does not connect to a common pin. The NTC 242 of the circuit diagram 240 of FIG. 1B connects to a common pin.

Figure 3A:
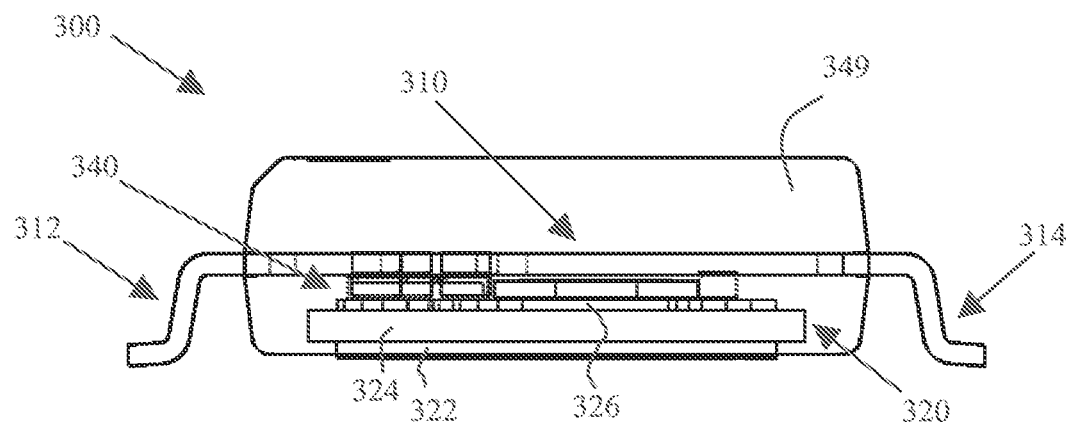
FIG. 3A is a side view of a power module containing a directly bonding copper (DBC) type of substrate and FIG. 3B is a side view of a power module containing an insulation metal substrate (IMS) in examples of the present disclosure.

FIG. 3A is a side view of a power module 300 in examples of the present disclosure. The power module 300 comprises a lead frame 310, a DBC type of substrate 320, a plurality of transistor dies 340, and a molding encapsulation 349. The lead frame 310 comprises a first plurality of lead frame leads 312 and a second plurality of lead frame leads 314. The DBC type of substrate 320 comprises a copper layer 322, a ceramic layer 324 on top of the copper layer 322, and a plurality of copper traces 326 on top of the ceramic layer 324. For showing internal components, the molding encapsulation 349 is shown in transparency.

In examples of the present disclosure, the copper layer 322 is of 0.127 mm in thickness. The ceramic layer 324 is of 0.38 mm in thickness. The plurality of copper traces 326 are of 0.2 mm in thickness.

Figure 3B:
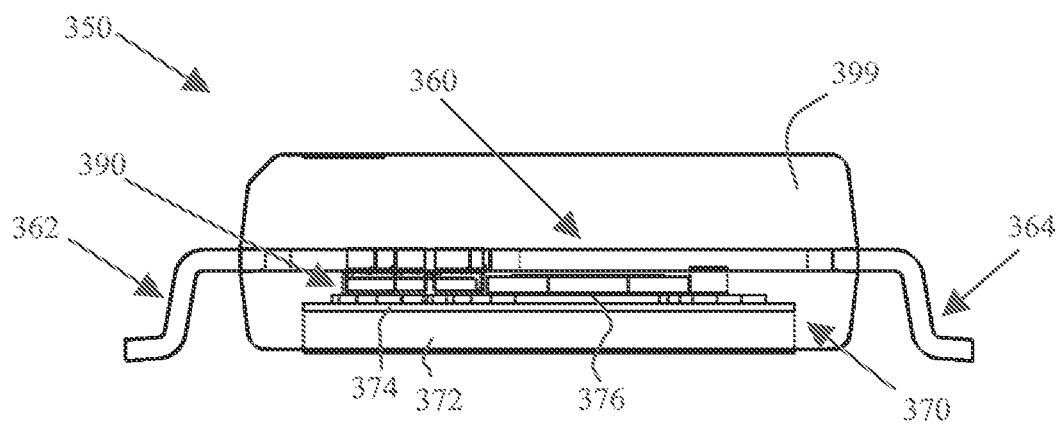

FIG. 3B is a side view of a power module 350 in examples of the present disclosure. The power module 350 comprises a lead frame 360, an IMS 370, a plurality of transistor dies 390, and a molding encapsulation 399. The lead frame 360 comprises a first plurality of lead frame leads 362 and a second plurality of lead frame leads 364. The IMS 370 comprises a layer 372, an insulation sheet 374 on top of the layer 372, and a plurality of copper traces 376 on top of the insulation sheet 374. The layer 372 is a copper layer or an aluminum layer. Each of the side edges of the insulation sheet 374 is aligned and is co-planar with a respective side edge of the side edges of the layer 372. For showing internal components, the molding encapsulation 399 is shown in transparency.

In examples of the present disclosure, the layer 372 is of 0.5 mm in thickness. The insulation sheet 374 is of 0.1 mm in thickness. The plurality of copper traces 326 are of 0.105 mm in thickness.

Figure 4:
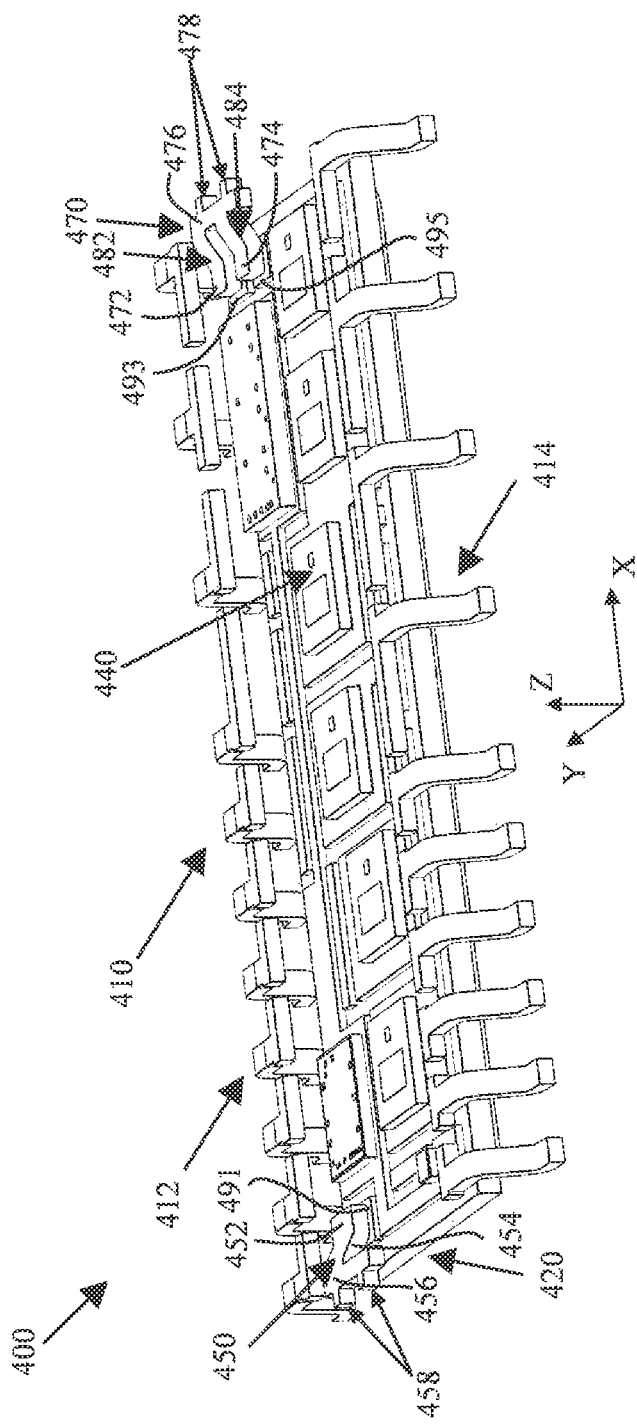
FIG. 4 is a perspective view of a portion of a power module in examples of the present disclosure.

FIG. 4 is a perspective view of a portion of a power module 400 in examples of the present disclosure. The power module 400 comprises a lead frame 410, a substrate 420, a first anchor pad 491 on the substrate 420 adjacent to a first short edge of the substrate 420, a second anchor pad 493 on the substrate 420 adjacent to a second short edge of the substrate 420, and a plurality of transistor dies 440. The lead frame 410 comprises a first lead frame anchored bar 450 adjacent to the first short edge of the substrate 420, a second lead frame anchored bar 470 adjacent to the second short edge of the substrate 420, a first plurality of lead frame leads 412 disposed along a first long edge of the substrate 420, and a second plurality of lead frame leads 414 disposed along a second long edge of the substrate 420. The first and second long edges and the first and second short edges substantially define a boundary of the substrate 420. The first lead frame anchored bar 450 comprises a tip portion 452 step down to attach onto the first anchor pad 491; a base portion 456 positioned higher (along Z-direction) than the tip portion 452; and a slanted portion 454 connecting the tip portion 452 to the base portion 456. The first lead frame anchored bar 450 further comprises two or more tie bar portions 458 extending from the base portion 456 opposite to the tip portion. Free end surfaces of the two or more tie bar portions 458 exposed from a sidewall of the molding encapsulation (for example, the molding encapsulation 349 of FIG. 3A) parallel and adjacent to the first short edge of the substrate 420.

In examples of the preset disclosure, the power module 400 further comprises a third anchor pad 495 on the substrate 420. The second lead frame anchored bar 470 comprises a base portion 476; a first prong 482 comprising a tip portion 472 step down to attach onto the second anchor pad 493; and a second prong 484 comprising a tip portion 474 step down to attach onto the third anchor pad 495. The second lead frame anchored bar 470 further comprises two or more tie bar portions 478 extending from the base portion 476 opposite to the tip portions. Free end surfaces of the two or more tie bar portions exposed from a sidewall of the molding encapsulation (for example, the molding encapsulation 349 of FIG. 3A) parallel and adjacent to the second short edge of the substrate 420. The base portion 476 of the second lead frame anchored bar 470 is positioned higher (along Z-direction) than the tip portion 472 of the first prong 482. The base portion 476 of the second lead frame anchored bar 470 is positioned higher (along Z-direction) than the tip portion 474 of the second prong 484. In one example, a top surface of the second anchor pad 493 is co-planar with a top surface of the third anchor pad 495.

FIG. 5A shows a power module 500 in examples of the present disclosure. The power module 500 comprises a lead frame 510, a substrate 520 mounted on the lead frame 510, a first anchor pad 507 on the substrate 520, a second anchor pad 509 on the substrate 520, a plurality of die pads 530 on the substrate 520, and a plurality of transistor dies 540 on the plurality of die pads 530. The lead frame 510 comprises a first lead frame anchored bar 517, a second lead frame anchored bar 519, a first plurality of lead frame leads 512, and a second plurality of lead frame leads 514. The first anchor pad 507 is attached to the first lead frame anchored bar 517. The second anchor pad 509 is attached to the second lead frame anchored bar 519.

In examples of the present disclosure, the substrate 520 is of a rectangular shape. The outer peripheral of a top surface of the substrate 520 comprises a first edge 520A, a second edge 520B, a third edge 520C, and a fourth edge 520D. The second edge 520B opposites the first edge 520A. The fourth edge 520D opposites the third edge 520C. A distance between the first edge 520A and the second edge 520B defines a length of the rectangular shape. A distance between the third edge 520C and the fourth edge 520D defines a width of the rectangular shape. In one example, the length of the rectangular shape is larger than the width of the rectangular shape. In examples of the present disclosure, the language "adjacent" refers to a shortest distance between an element and an edge is smaller than a length of the element. The first anchor pad 507 is adjacent the first edge 520A. For example, a distance between a left-side of the first anchor pad 507 and the first edge 520A is smaller than a length of the first anchor pad 507. The second anchor pad 509 is adjacent the second edge 520B. For example, a distance between a right-side of the second anchor pad 509 and the second edge 520B is smaller than a length of the second anchor pad 509.

In examples of the present disclosure, the first anchor pad 507 is on the left-side of the power module 500. The second anchor pad 509 is on the right-side of the power module 500. A tip of the first lead frame anchored bar 517 is attached to the first anchor pad 507 by glue or solder. A tip of the second lead frame anchored bar 519 is attached to the second anchor pad 509 by glue or solder. It saves space for not using leads between the lead frame anchored bars and the anchor pads so as to reduce the length of the power module 500.

In examples of the present disclosure, the first anchor pad 507 is adjacent the third edge 520C of the substrate 520. A distance between the first anchor pad 507 and the third edge 520C of the substrate 520 is smaller than a distance between the first anchor pad 507 and the fourth edge 520D of the substrate 520. The second anchor pad 509 is adjacent the third edge 520C of the substrate 520. A distance between the second anchor pad 509 and the third edge 520C of the substrate 520 is smaller than a distance between the second anchor pad 509 and the fourth edge 520D of the substrate 520.

In examples of the present disclosure, the plurality of die pads 530 comprises a first die pad 530A, a second die pad 530B, a third die pad 530C, and a fourth die pad 530D. The plurality of transistor dies 540 comprises a first transistor die 540A, a second transistor die 540B, a third transistor die 540C, a fourth transistor die 540D, a fifth transistor die 540E, and a sixth transistor die 540F. The first transistor die 540A is disposed on the first die pad 530A. The second transistor die 540B is disposed on the second die pad 530B. The third transistor die 540C is disposed on the third die pad 530C. The fourth transistor die 540D, the fifth transistor die 540E, and the sixth transistor die 540F are disposed on the fourth die pad 530D.

In examples of the present disclosure, the first die pad 530A, the second die pad 530B, the third die pad 530C, and the fourth die pad 530D are separated from one another and are positioned in sequence between the first edge 520A of the substrate 520 and the second edge 520B of the substrate 520. A distance between the first die pad 530A and the first edge 520A of the substrate 520 is smaller than a distance between the fourth die pad 530D and the first edge 520A of the substrate 520.

In examples of the present disclosure, the first plurality of lead frame leads 512 are disposed along the third edge 520C of the substrate 520. The second plurality of lead frame leads 514 are disposed along the fourth edge 520D of the substrate 520.

In examples of the present disclosure, the power module 500 further comprises a first IC pad 531 on the substrate 520; and a first control IC die 541 on the first IC pad 531. The first IC pad 531 is disposed between the third edge 520C of the substrate 520 and at least a portion of the fourth die pad 530D.

In examples of the present disclosure, the power module 500 further comprises a first plurality of bonding wires 552; a second plurality of bonding wires 554; and two or more connecting traces 559 on the substrate 520. In one example, the two or more connecting traces 559 comprises a first connecting trace 559A, a second connecting trace 559B, and a third connecting trace 559C. Each of the two or more connecting traces 559 comprises a first end area; and a second end area opposite the first end area. The first control IC die 541 comprises a plurality of contact pads 543. The first end area of each of the two or more connecting traces 559 is connected to a respective lead of the first plurality of lead frame leads 512 by a respective bonding wire of the first plurality of bonding wires 552. The second end area of each of the two or more connecting traces 559 is connected to a respective contact pad of the plurality of contact pads 543 of the first control IC die 541 by a respective bonding wire of the second plurality of bonding wires 554.

In examples of the present disclosure, the power module 500 further comprises a second IC pad 535 on the substrate 520; and a second control IC die 545 on the second IC pad 535. The second IC pad 535 is disposed between the third edge 520C of the substrate 520 and the first die pad 530A.

In examples of the present disclosure, the first IC pad 531 is adjacent the third edge 520C of the substrate 520. The second IC pad 535 is adjacent the first edge 520A of the substrate 520. Therefore, a center area of a top surface of the substrate 520 can be used for a portion of the plurality of die pads 530 and traces.

In examples of the present disclosure, the first IC pad 531 is between the second IC pad 535 and the second anchor pad 509.

In examples of the present disclosure, the first IC pad 531 and the second IC pad 535 are connected by a trace 579.

In examples of the present disclosure, the power module 500 further comprises a trace 564 on the substrate 520. The trace 564 comprises a first portion 564A parallel to the first edge 520A of the substrate 520. The second IC pad 535 is directly connected to the trace 564. The first portion 564A of the trace 564 is between the first die pad 530A and the first edge 520A of the substrate 520.

FIG. 5B shows a power module 580 in examples of the present disclosure. The power module 580 of FIG. 5B is similar to the power module 500 of FIG. 5A. The power module 580 of FIG. 5B comprises an NTC die 582.

FIG. 5C shows a power module 590 in examples of the present disclosure. The power module 590 of FIG. 5C is similar to the power module 500 of FIG. 5A. The power module 590 of FIG. 5C comprises a lead frame 510, a substrate 520 mounted on the lead frame 510, a first die pad 530A, an NTC pad 591 on the substrate 520, and an NTC die 592 on the NTC pad 591. The NTC pad 591 is disposed between the first die pad 530A and the first edge 520A of the substrate 520.

FIG. 6A shows a power module 600 in examples of the present disclosure. The power module 600 comprises a lead frame 610, a substrate 620 mounted on the lead frame 610, a first anchor pad 607 on the substrate 620, a second anchor pad 609 on the substrate 620, a plurality of die pads 630 on the substrate 620, and a plurality of transistor dies 640 on the plurality of die pads 630. The lead frame 610 comprises a first lead frame anchored bar 617, a second lead frame anchored bar 619, a first plurality of lead frame leads 612, and a second plurality of lead frame leads 614. The first anchor pad 607 is attached to the first lead frame anchored bar 617. The second anchor pad 609 is attached to the second lead frame anchored bar 619.

In examples of the present disclosure, the substrate 620 is of a rectangular shape. The outer peripheral of a top surface of the substrate 620 comprises a first edge 620A, a second edge 620B, a third edge 620C, and a fourth edge 620D. The second edge 620B opposites the first edge 620A. The fourth edge 620D opposites the third edge 620C.

In examples of the present disclosure, the plurality of die pads 630 comprises a first die pad 630A, a second die pad 630B, a third die pad 630C, and a fourth die pad 630D. The plurality of transistor dies 640 comprises a first transistor die 640A, a second transistor die 640B, a third transistor die 640C, a fourth transistor die 640D, a fifth transistor die 640E, and a sixth transistor die 640F. The first transistor die 640A is disposed on the first die pad 630A. The second transistor die 640B is disposed on the second die pad 630B. The third transistor die 640C is disposed on the third die pad 630C. The fourth transistor die 640D, the fifth transistor die 640E, and the sixth transistor die 640F are disposed on the fourth die pad 630D.

In examples of the present disclosure, the first die pad 630A, the second die pad 630B, the third die pad 630C, and the fourth die pad 630D are separated from one another and are positioned in sequence between the first edge 620A of the substrate 620 and the second edge 620B of the substrate 620. A distance between the first die pad 630A and the first edge 620A of the substrate 620 is smaller than a distance between the fourth die pad 630D and the first edge 620A of the substrate 620.

In examples of the present disclosure, the power module 600 further comprises a first IC pad 631 on the substrate 620; and a first control IC die 641 on the first IC pad 631. The first IC pad 631 is disposed between the third edge 620C of the substrate 620 and at least a portion of the fourth die pad 630D.

In examples of the present disclosure, an extension portion 639 of the fourth die pad 630D is between the first IC pad 631 and the second anchor pad 609.

In examples of the present disclosure, the power module 600 further comprises a first plurality of bonding wires 652; a second plurality of bonding wires 654; and two or more connecting traces 659 on the substrate 620. In one example, the two or more connecting traces 659 comprises a first connecting trace 659A, a second connecting trace 659B, and a third connecting trace 659C. Each of the two or more connecting traces 659 comprises a first end area; and a second end area opposite the first end area. The first control IC die 641 comprises a plurality of contact pads 643. The first end area of each of the two or more connecting traces 659 is connected to a respective lead of the first plurality of lead frame leads 612 by a respective bonding wire of the first plurality of bonding wires 652. The second end area of each of the two or more connecting traces 659 is connected to a respective contact pad of the plurality of contact pads 643 of the first control IC die 641 by a respective bonding wire of the second plurality of bonding wires 654.

In examples of the present disclosure, the power module 600 further comprises a trace 662 on the substrate 620. The trace 662 comprises a first portion 662A parallel to the fourth edge 620D of the substrate 620; and a second portion 662B parallel to the second edge 620B of the substrate 620. The third die pad 630C is directly connected to the trace 662. The first portion 662A of the trace 662 is between the fourth die pad 630D and the fourth edge 620D of the substrate 620. The second portion 662B of the trace 662 is between the fourth die pad 630D and the second edge 620B of the substrate 620.

In examples of the present disclosure, the power module 600 further comprises a trace 664 on the substrate 620. The trace 664 comprises a first portion 664A parallel to the first edge 620A of the substrate 620. The first IC pad 631 is directly connected to the trace 664. The first portion 664A of the trace 664 is between the first die pad 630A and the first edge 620A of the substrate 620.

FIG. 6B shows a power module 680 in examples of the present disclosure. The power module 680 of FIG. 6B is similar to the power module 600 of FIG. 6A. The power module 680 of FIG. 6B comprises an NTC die 682.

FIG. 6C shows a power module 690 in examples of the present disclosure. The power module 690 of FIG. 6C is similar to the power module 600 of FIG. 6A. The power module 690 of FIG. 6C comprises a lead frame 610, a substrate 620 mounted on the lead frame 610, a first die pad 630A, an NTC pad 691 on the substrate 620, and an NTC die 692 on the NTC pad 691. The NTC pad 691 is disposed between the first die pad 630A and the first edge 620A of the substrate 620.

Those of ordinary skill in the art may recognize that modifications of the embodiments disclosed herein are possible. For example, a shape of the fourth die pad 530D may vary. Other modifications may occur to those of ordinary skill in this art, and all such modifications are deemed to fall within the purview of the present invention, as defined by the claims.

The invention claimed is:

1. A semiconductor power module package comprising:
   a lead frame comprising
      a first lead frame anchored bar;
      a second lead frame anchored bar;
      a first plurality of lead frame leads; and
      a second plurality of lead frame leads;
   a substrate mounted on the lead frame;
   a first anchor pad on the substrate, the first anchor pad being attached to the first lead frame anchored bar;
   a second anchor pad on the substrate, the second anchor pad being attached to the second lead frame anchored bar;
   a plurality of die pads on the substrate;
   a plurality of transistor dies on the plurality of die pads;
   a first integrated circuit (IC) pad on the substrate; and
   a first control IC die on the first IC pad;
   wherein the plurality of die pads comprises
      a first die pad;
      a second die pad;
      a third die pad; and
      a fourth die pad; and
   wherein the plurality of transistor dies comprises
      a first transistor die disposed on the first die pad;
      a second transistor die disposed on the second die pad;
      a third transistor die disposed on the third die pad; and
      a fourth transistor die, a fifth transistor die, and a sixth transistor die disposed on the fourth die pad;
   wherein the substrate further comprises
      a first edge;
      a second edge opposite the first edge;
      a third edge; and
      a fourth edge opposite the third edge;
   wherein the first die pad, the second die pad, the third die pad, and the fourth die pad are separated from one another and are positioned in sequence between the first edge of the substrate and the second edge of the substrate;
   wherein a distance between the first die pad and the first edge of the substrate is smaller than a distance between the fourth die pad and the first edge of the substrate;
   wherein the first plurality of lead frame leads are disposed along the third edge of the substrate;
   wherein the second plurality of lead frame leads are disposed along the fourth edge of the substrate;
   wherein the first IC pad is disposed between the third edge of the substrate and at least a portion of the fourth die pad;
   wherein a distance between the first anchor pad and the third edge of the substrate is smaller than a distance between the first anchor pad and the fourth edge of the substrate; and
   wherein a distance between the second anchor pad and the third edge of the substrate is smaller than a distance between the second anchor pad and the fourth edge of the substrate.

2. The semiconductor power module package of claim 1, wherein an extension portion of the fourth die pad is between the first IC pad and the second anchor pad.

3. The semiconductor power module package of claim 1 further comprising a trace on the substrate;
   wherein the trace comprises
      a first portion parallel to the fourth edge of the substrate; and
      a second portion parallel to the second edge of the substrate;
   wherein the third die pad is directly connected to the trace;
   wherein the first portion of the trace is between the fourth die pad and the fourth edge of the substrate; and
   wherein the second portion of the trace is between the fourth die pad and the second edge of the substrate.

4. The semiconductor power module package of claim 1 further comprising a trace on the substrate;
   wherein the trace comprises
      a first portion parallel to the first edge of the substrate;
   wherein the first IC pad is directly connected to the trace; and
   wherein the first portion of the trace is between the first die pad and the first edge of the substrate.

5. The semiconductor power module package of claim 1 further comprising
   a negative temperature chip (NTC) pad on the substrate; and an NTC die on the NTC pad;
wherein the NTC pad is disposed between the first die pad and the first edge of the substrate.

6. The semiconductor power module package of claim 1 further comprising
a second IC pad on the substrate; and
a second control IC die on the second IC pad;
wherein the second IC pad is disposed between the third edge of the substrate and the first die pad.

7. The semiconductor power module package of claim 6, wherein the first IC pad is between the second IC pad and the second anchor pad.

8. The semiconductor power module package of claim 6, wherein the first IC pad and the second IC pad are connected by a trace.

9. The semiconductor power module package of claim 6 further comprising a trace on the substrate;
wherein the trace comprises
a first portion parallel to the first edge of the substrate;
wherein the second IC pad is directly connected to the trace; and
wherein the first portion of the trace is between the first die pad and the first edge of the substrate.

10. The semiconductor power module package of claim 1, wherein the first lead frame anchored bar comprises
a tip portion on the first anchor pad;
a base portion positioned higher than the tip portion; and
a slanted portion connecting the tip portion to the base portion.

11. The semiconductor power module package of claim 1 further comprising a third anchor pad on the substrate;
wherein the second lead frame anchored bar comprises
a first prong; and
a second prong comprising
a tip portion on the third anchor pad.

* * * * *